United States Patent
Ouchi et al.

(10) Patent No.: US 8,077,510 B2
(45) Date of Patent: Dec. 13, 2011

(54) SRAM DEVICE

(75) Inventors: Shinichi Ouchi, Tsukuba (JP); Yongxun Liu, Tsukuba (JP); Meishoku Masahara, Tsukuba (JP); Takashi Matsukawa, Tsukuba (JP); Kazuhiko Endo, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 12/517,696

(22) PCT Filed: Dec. 6, 2007

(86) PCT No.: PCT/JP2007/073605
§ 371 (c)(1),
(2), (4) Date: Sep. 17, 2010

(87) PCT Pub. No.: WO2008/069277
PCT Pub. Date: Jun. 12, 2008

(65) Prior Publication Data
US 2010/0328990 A1    Dec. 30, 2010

(30) Foreign Application Priority Data
Dec. 7, 2006  (JP) .................................. 2006-330642

(51) Int. Cl.
*G11C 11/34* (2006.01)
*G11C 11/00* (2006.01)

(52) U.S. Cl. .......................... 365/184; 365/156; 365/154
(58) Field of Classification Search ................... 365/156
See application file for complete search history.

(56) References Cited

U.S. PATENT DOCUMENTS

| | | | | |
|---|---|---|---|---|
| 5,600,588 | A | 2/1997 | Kawashima | |
| 7,286,319 | B2* | 10/2007 | Kida et al. | 360/78.14 |
| 7,639,525 | B2* | 12/2009 | Yamaoka et al. | 365/154 |
| 2006/0274569 | A1* | 12/2006 | Joshi et al. | 365/154 |
| 2008/0186752 | A1* | 8/2008 | Kim | 365/63 |

FOREIGN PATENT DOCUMENTS

| | | |
|---|---|---|
| JP | 7 211079 | 8/1995 |
| JP | 2006 295653 | 10/2006 |

* cited by examiner

*Primary Examiner* — Hoai V Ho
*Assistant Examiner* — Min Huang
(74) *Attorney, Agent, or Firm* — Oblon, Spivak, McClelland, Maier & Neustadt, L.L.P.

(57) ABSTRACT

An SRAM device including a memory cell, the memory cell having two access transistors connected to a word line, and a flip-flop circuit having complementary transistors, the transistor being a field effect transistor having a standing semiconductor thin plate, a logic signal input gate and a bias voltage input gate, the gates sandwiching the semiconductor thin plate and being electrically separated from each other, a first bias voltage is applied to bias voltage input gates of the transistors of the memory cells in a row including a memory cell being accessed for reading or writing, and a second bias voltage is applied to the bias voltage input gates of the transistors of the memory cells in a row including a memory cell under memory holding operation.

4 Claims, 18 Drawing Sheets

SRAM DEVICE

TECHNICAL FIELD

The present invention relates to an SRAM (Static Random Access Memory) device.

BACKGROUND ART

Conventional CMOS (Complementary Metal-Oxide-Semiconductor) SRAM cells consist of planar MOSFETs (Metal-Oxide-Semiconductor Field-Effect Transistors) on silicon substrates such as bulk wafer or SOI (Silicon On Insulator) wafer. Reduction in the device dimension has been performed for the purpose of enhancing performance such as integration density and operation speed, however, recently, it conversely increases the short channel effect and threshold voltage variations. As a result, leak current during a memory holding operation tends to occupy a large portion of the total power consumption in the SRAM device using planar MOSFETs.

For the purpose of suppressing the leak current and realizing low power consumption, Patent Document 1 mentioned below and others disclose a technology to reduce a standby current by varying the supply voltage supplied to a memory cell in response to the operation of the cell and utilizing effectively the substrate bias effect caused thereby.

In the device described in Patent Document 1, when the cell is accessed, the supply voltage of the cell is controlled so as to apply the entire voltage between the higher voltage source and the ground levels to the cell. When the cell is not accessed, the potential at a node on the low potential side of the cell is set higher than the ground potential. Thus, the leak current is reduced due to the substrate bias effect and the reduced supply voltage.

However, reduction in the supply voltage amplitude induces reduction in noise margin. This reduction in noise margin becomes a severe problem since the more the feature size of the transistor is reduced, the more the threshold voltage variations increase (See Non-Patent Document 1 mentioned below).

One of the alternative ways to realize low power consumption by reducing the supply voltage amplitude is to vary the substrate bias voltage row by row. In other words, in order to prevent the leak current, unaccessed cells are operated at a higher threshold voltage by applying a lower the substrate bias voltage than that of accessed cells.

However, in the SRAM device using conventional bulk planar MOSFETs, it is not possible to apply different substrate bias voltages row by row. This is the reason why the supply voltage has been varied. For applying different substrate bias voltages row by row in the bulk planar MOSFET, it is required to introduce a process to electrically separate each well, which further requires additional areas on a chip.

In addition, according to Non-Patent Document 1, it will be more difficult for the bulk planar MOSFET to suppress increase of the short channel effect. This means that the leak current will also increase. Accordingly, it is likely that the increases in the chip area and process cost do not have much effect.

[Patent Document 1] Japanese Unexamined Patent Application Publication 2004-206745.
[Non-Patent Document 1] ITRS 2005, International Technology Roadmap for Semiconductor 2005 edition, http://public.itrs.net

DISCLOSURE OF INVENTION

The object of the present invention is to solve the problem described above and to provide an SRAM device that operates stably at low power consumption without reducing the operation speed.

The issue described above can be solved by a device described below.

(1) An SRAM device comprising a memory cell, the memory cell comprising two access transistors connected to a word line, and a flip-flop circuit having complementary transistors, the transistor being a field effect transistor having a standing semiconductor thin plate, a logic signal input gate and a bias voltage input gate, the gates sandwiching the semiconductor thin plate and being electrically separated from each other, and wherein a first bias voltage is applied to bias voltage input gates of the transistors of the memory cells in a row including a memory cell being accessed for reading or writing such that the threshold voltage on the logic signal input gates of the transistors is set low, and a second bias voltage is applied to the bias voltage input gates of the transistors of the memory cells in a row including a memory cell under memory holding operation such that the threshold voltage on the logic signal input gates of the transistors is set high.

(2) The SRAM device according to claim 1, further comprising a row-decoder to output a signal, wherein the first bias voltage and the second bias voltage are switched by a signal generated by shifting the level of the row-decoder output signal.

(3) The SRAM device according to claim 2, wherein the word line is selected after an address signal arrives at the row decoder and a switching operation of the bias voltage in each row is completed.

(4) The SRAM device according to claim 3, wherein the word line is driven by a signal which is generated from a signal on an interconnection line of the bias voltage input gates by shifting the signal swing from that between the first bias voltage and the second bias voltage to that between a low voltage source $V_{SS}$ and a high voltage source $V_{DD}$, according to whether the bias voltage of the bias voltage input gate is set to the first bias voltage or the second bias voltage.

(5) The SRAM device according to claim 1, wherein a bias voltage of the access transistors is set to a voltage different from a bias voltage of the complementary transistors in the flip-flop circuit.

(6) The SRAM device according to claim 5, wherein a bias voltage of the access transistors in an accessed row is set to a value different from a bias voltage of the access transistors in an unaccessed row.

(7) The SRAM device according to any one of claims 1 to 6, wherein the interconnection line connecting the bias voltage input gates of the transistors in the memory cell and the interconnection line connecting the bias voltage input gates of the access transistors are arranged in parallel with the word line.

Unlike the planar MOS, according to the present invention, different voltages can be applied to each row of an SRAM array. As a result, the leak current can be reduced in the SRAM cells under memory holding operation without causing operational instability resulting from the reduction in the supply voltage amplitude. In addition, operational stability can be increased by setting the threshold voltage of the access transistor at a different value from that of the cell. Thus, the SRAM device that operates stably at low power consumption without reducing the operation speed can be provided.

DESCRIPTION OF THE REFERENCE NUMERALS

Figure 1:
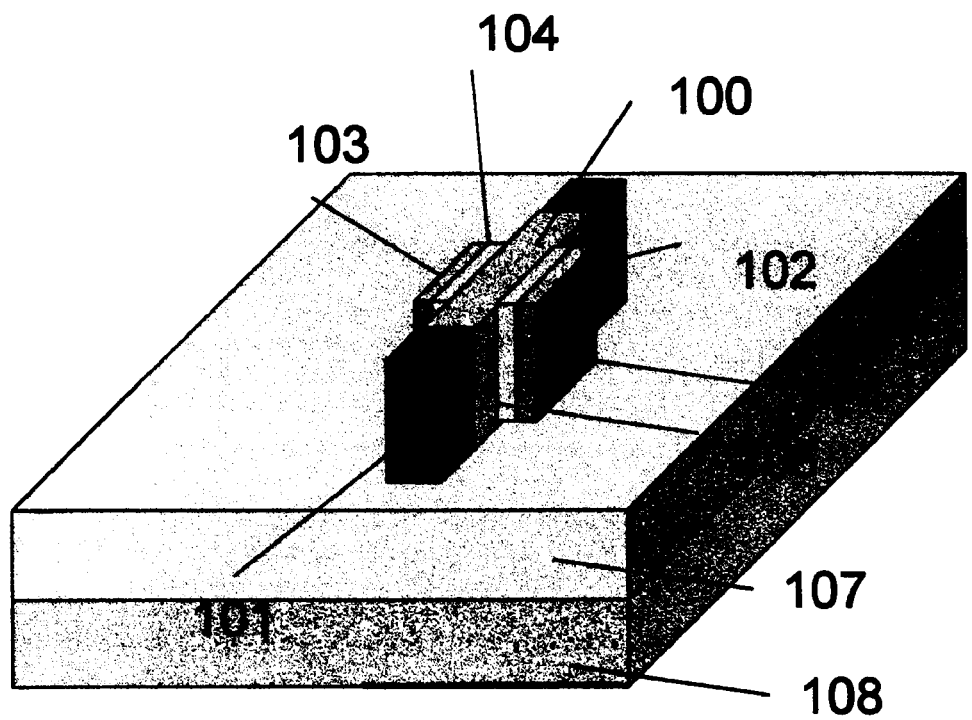
FIG. 1 is a schematic diagram showing a device structure of a four-terminal double-gate field effect transistor.

100: a standing SOI thin plate fabricated from an SOI wafer
200: an n-channel field effect transistor
205: a p-channel filed effect transistor
300: an SRAM cell
401: a circuit block including a row decoder and the same number of circuit blocks 500 as rows
402: a bias voltage generation circuit
403: a column decoder
500: a circuit block including a level shifter and a transmission gate
501: a row decoder
502: a CMOS inverter
503: an SRAM cell
900: a circuit block including a level shifter and a CMOS inverter
901: a CMOS inverter
1001: a circuit block including the same number of circuit blocks
900 as rows
1300: a circuit block including a level shifter and a CMOS inverter
1401: a circuit block including the same number of circuit blocks 900 and circuit blocks 1300 as rows
1402: a bias voltage generation circuit
1602: an AND logic gate that generates a signal applied to WL
1801: a time adjustment buffer
1901: a time adjustment buffer

BEST MODE FOR CARRYING OUT THE INVENTION

FIG. 1 is a schematic diagram showing a device structure of a field effect transistor used in an SRAM. The transistor comprises a standing SOI thin plate 100 fabricated from an SOI wafer, a source electrode 100 and a drain electrode 102, both of which are highly doped with impurities, a first gate electrode 103, a gate insulating film 104, a second gate electrode 105, a gate oxide film 106, a BOX (Buried Oxide) layer 107, and a semiconductor substrate layer 108. As shown in FIG. 1, the field effect transistor comprises two gate electrodes that sandwich the standing semiconductor thin plate and are electrically separated from each other. This transistor is hereinafter called a four-terminal double-gate field effect transistor. The function equivalent to the transistor shown in FIG. 1 can be achieved by using a typical bulk wafer that does not have the SOI structure, by forming 100, 104, 106 and 108 from the same silicon layer, and depositing 107. Therefore, the present invention can apply similarly to such a device fabricated from the bulk wafer.

When the first gate electrode 103 is a logic signal input gate and the second gate electrode 105 is a bias voltage input gate, the threshold voltage of the transistor on the logic signal input gate can be varied according to the input voltage applied to the bias voltage input gate, and an effect similar to the substrate bias effect in the bulk planar MOS can be realized. Unlike the bulk planar MOS, however, when the transistor of the present invention is used in an integrated circuit, the threshold voltage of each transistor can be set independently.

Figure 2:
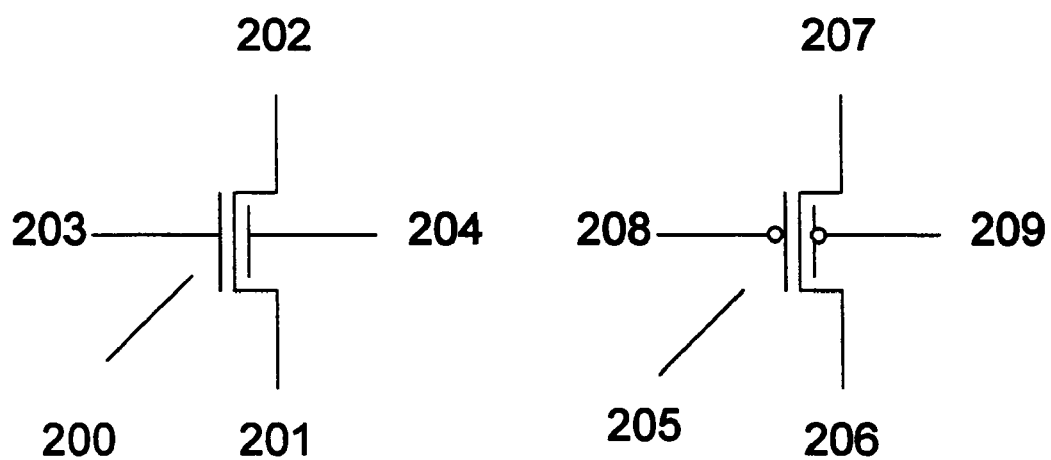
FIG. 2 is a diagram illustrating symbols of an n-channel four-terminal double-gate field effect transistor and a p-channel four-terminal double-gate transistor.

FIG. 2 shows symbols of the four-terminal double-gate field effect transistors. An n-channel field effect transistor 200, and a p-channel field effect transistor 205 are shown. Terminals of the n-channel field effect transistor 200 are a source terminal 201, a drain terminal 202, a first gate terminal 203, and a second gate terminal 204. Terminals of the p-channel field effect transistor 205 are a source terminal 206, a drain terminal 207, a first gate terminal 208, and a second gate terminal 209.

Figure 3:
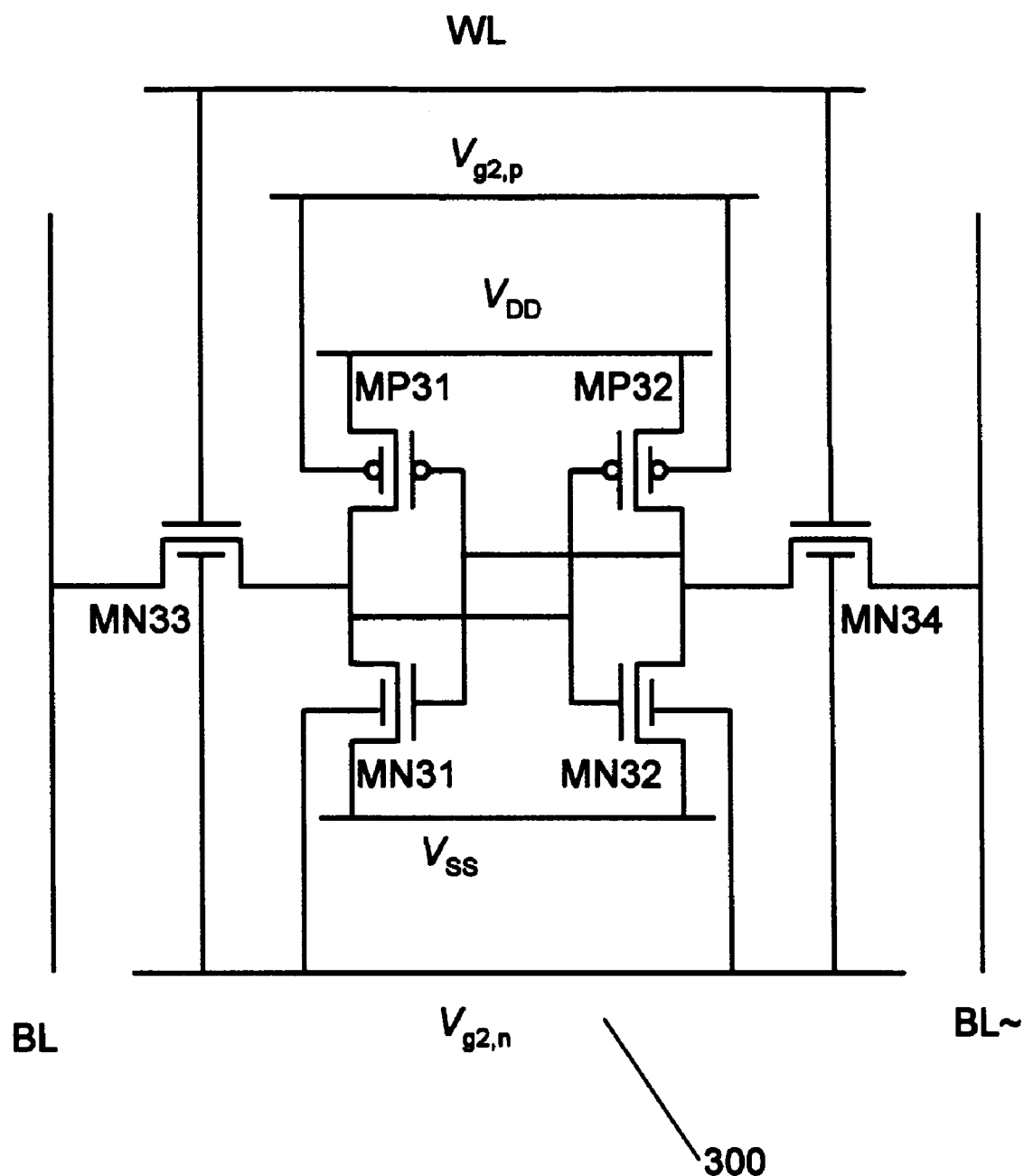
FIG. 3 is a circuit diagram showing a configuration of an SRAM cell using four-terminal double-gate field effect transistors in accordance with the first embodiment of the present invention.
Figure 4:
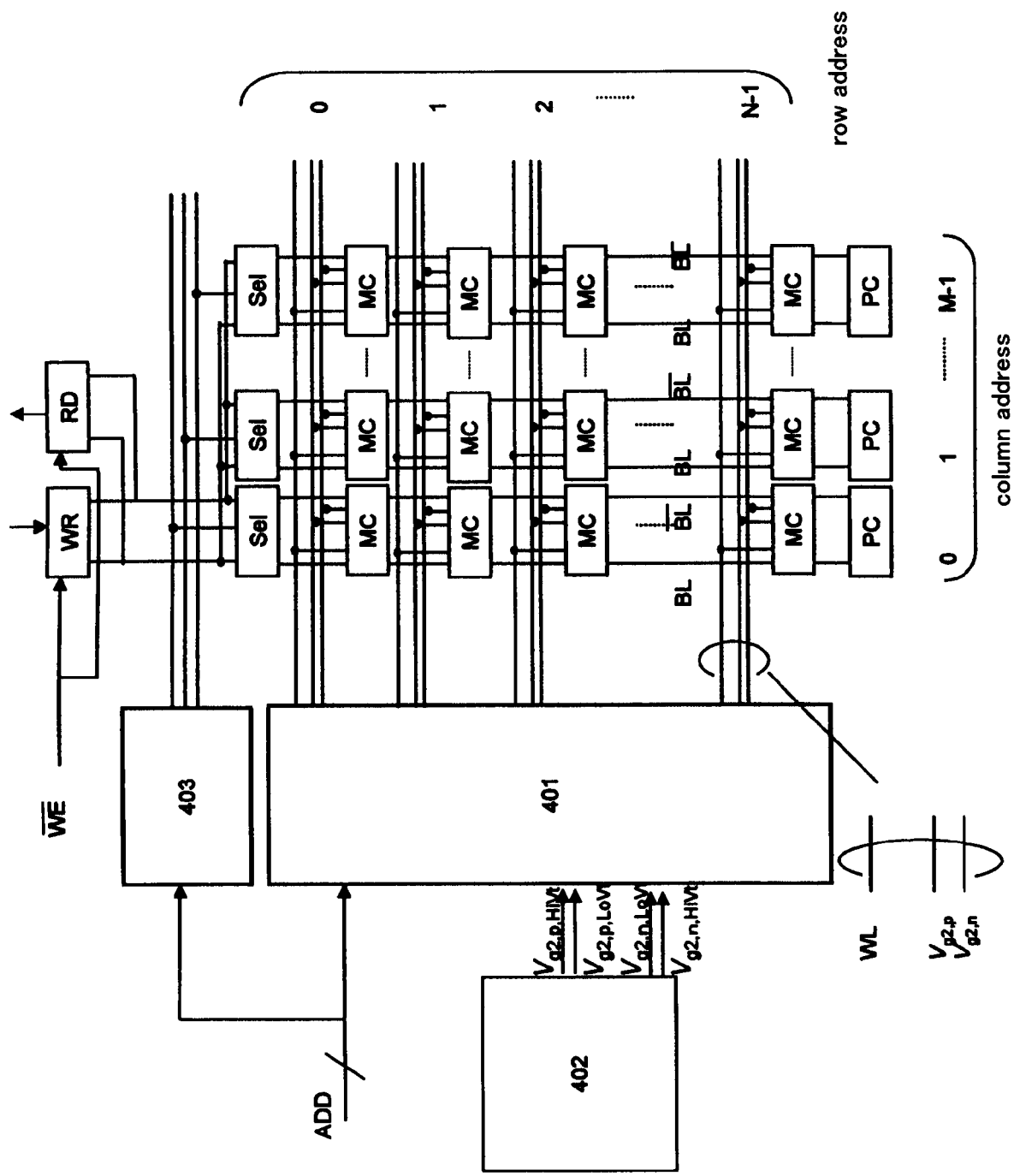
FIG. 4 is a block diagram showing a configuration of an SRAM device comprising an SRAM cell 300 using four-terminal double-gate field effect transistors in accordance with the first embodiment of the present invention.

The following three embodiments describe configurations of the SRAM device using the four-terminal double-gate field effect transistors First Embodiment In this embodiment, an SRAM cell 300 is configured as shown in FIG. 3, and an SRAM cell array is configured as shown in FIG. 4 by using the SRAM cell 300. Memory holding is performed by a flip-flop circuit that is a combination of an inverter consisting of four-terminal double-gate field effect transistors MN 31 and MP 31, and an inverter consisting of four-terminal double-gate field effect transistors MN 32 and MP 32. Writing and reading of the memory contents from and to a pair of bit lines BL and BL~ are performed by using access transistors MN 33 and MN 34, which are four-terminal double-gate field effect transistors that can be switched on and off by a signal applied to the word line WL. Gates of MOSFETs used in the conventional SRAM cell correspond to the first gates of MN 31, MP 31, MN 32, MP 32, MN 33 and MN 34. The second gates of these four-terminal double-gate field effect transistors are isolated from a high voltage source line $V_{DD}$ and a low voltage source line $V_{SS}$, and are connected either to a voltage source line $V_{g2,n}$ for controlling the threshold voltage on the first gates of the n-channel field effect transistors or to a voltage source line $V_{g2,p}$ for controlling the threshold voltage on the first gates of the p-channel field effect transistors, in accordance with the polarity of respective transistors. The voltage source lines $V_{g2,p}$ and $V_{g2,n}$ are led outside the cell in parallel with the word line WL.

In the SRAM cell array shown in FIG. 4, MC indicates the SRAM cell 300, PC is a precharge circuit as used in the conventional SRAM device, Sel is a selector circuit that selects the pair of the bit lines in response to an output of a column decoder 403, and WR and RD are circuits for writing and reading, respectively. Since PC, Sel, WR, RD and the column decoder are well known in the conventional SRAM device, they are not explained here. Newly introduced circuits here are a circuit block 401 and a circuit 402. The circuit 402 is a bias voltage generation circuit to generate four supply voltages $V_{g2,p,HiVt}$, $V_{g2,n,HiVt}$, $V_{g2,p,LoVt}$ and $V_{g2,n,LoVt}$. The circuit block 401 has a function as a row decoder as well as a function to select $V_{g2,p}$ and $V_{g2,n}$ from the supply voltages $V_{g2,p,HiVt}$, $V_{g2,n,HiVt}$, $V_{g2,p,LoVt}$ and $V_{g2,n,LoVt}$ supplied from the circuit 402 and provide the selected $V_{g2,p}$ and $V_{g2,n}$ for each row in response to the decoded result. Since the interconnection lines for determining $V_{g2,p}$ and $V_{g2,n}$ for each row are arranged in parallel with the word line WL as shown in FIG. 3, the threshold voltage of the field effect transistor can be set row by row.

In an SRAM array having N rows as shown in FIG. 4, a row containing an accessed cell is operated with the low threshold voltage, and the other N−1 rows are operated with the high threshold voltage, thereby enabling to reduce the power consumption caused by the leak current. In other words, when a leak current is $I_{off,LoVt}$ during a low threshold voltage operation and a leak current is $I_{off,HiVt}$ during a high threshold voltage operation, the power consumption resulting from the leak current reduces by a factor $1/N+((N-1)/N) \times (I_{off,HiVt}/I_{off,LoVt})$ as compared to a case without the threshold voltage control. Thus, an effect equivalent to the substrate bias effect can be obtained without reducing the supply voltage, thereby enhancing the stability for the threshold voltage variations among the transistors.

Figure 6:
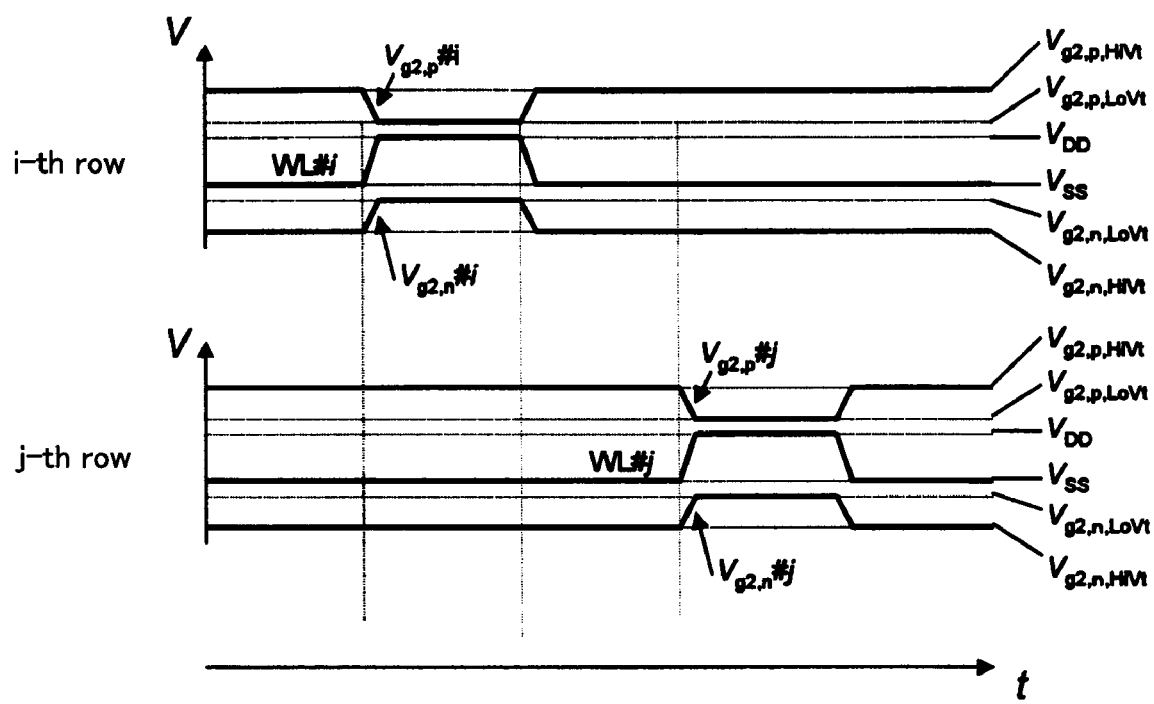
FIG. 6 is a schematic view showing variation in bias voltages applied to an SRAM cell with respect to time (t) in accordance with the first embodiment of the present invention.

In order to control the threshold value appropriately, voltage sources $V_{g2,p,HiVt}$ and $V_{g2,n,HiVt}$ which realize a high threshold voltage condition in the p-channel field effect transistor and the n-channel field effect transistor, respectively, and voltage sources $V_{g2,p,LoVt}$ and $V_{g2,n,LoVt}$ which realize a low threshold voltage condition in the p-channel field effect transistor and the n-channel field effect transistor, respectively, are required. The bias voltage is changed in each row when a row to be accessed is changed. This bias voltage change is schematically illustrated in FIG. 6. In FIG. 6, only the i-th row is accessed first and then the j-th row is accessed. In more detail, when the bias voltage generation circuit 402 detects the row address for the i-th row among N rows of the memory cells in the address ADD, the signal level on the i-th WL (WL#i) is changed to a high level, while keeping those on the other WLs including the j-th WL (WL#j) at a low level. At the same time, the i-th $V_{g2,p}$ ($V_{g2,p}$#i) is changed from $V_{g2,p,HiVt}$ to $V_{g2,p,LoVt}$, and the i-th $V_{g2,n}$ ($V_{g2,n}$#i) is changed from $V_{g2,n,HiVt}$ to $V_{g2,n,LoVt}$. $V_{g2,p}$ and $V_{g2,n}$ of the other rows including the j-th row are kept to be $V_{g2,p,HiVt}$ and $V_{g2,n,HiVt}$, respectively. After the access to the i-th row is finished, the signal level on the i-th WL, $V_{g2,p}$ and $V_{g2,n}$ are returned to the original low level value, $V_{g2,p,HiVt}$ and $V_{g2,n,HiVt}$, respectively, and precharge is performed. After the precharge, when the j-th row is accessed, the same process as described above is repeated for the j-th row and the other rows including the i-th row.

In general, magnitude relation of the voltages is $V_{g2,n,HiVt} < V_{g2,n,LoVt} < V_{g2,p,LoVt} < V_{g2,p,HiVt}$, and with respect to the high power-supply voltage $V_{DD}$ and the low power-supply voltage $V_{SS}$, $V_{g2,n,HiVt} < V_{SS}[=0] < V_{DD} < V_{g2,p,HiVt}$. Therefore, a function to reliably transmit $V_g2$ having an amplitude larger than the supply voltage to the second gate is realized by the configuration shown in FIG. 5.

Figure 5:
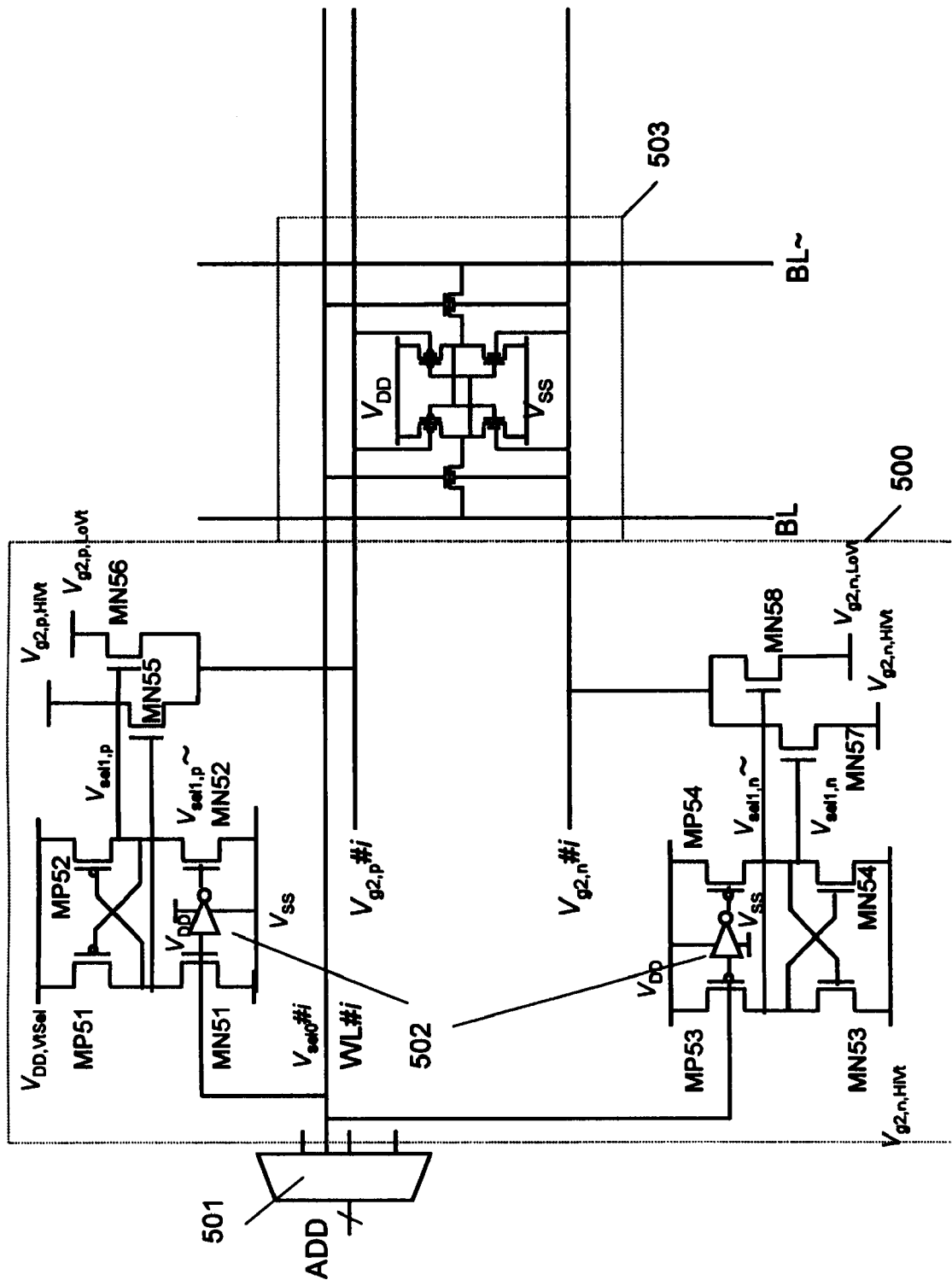
FIG. 5 is a circuit diagram showing an internal configuration of a circuit block 401.

An SRAM cell 503 shown in FIG. 5 is contained in the i-th row and has the same configuration as the SRAM cell 300. A circuit block 500 comprises a level shifter consisting of p-channel MOS transistors MP51, MP52, n-channel MOS transistors MN51 and MN52, a level shifter consisting of p-channel MOS transistors MP53, MP54, n-channel MOS transistors MN53 and MN54, a CMOS inverter 502 operated by the voltage sources $V_{DD}$ and $V_{SS}$ to drive these level shifters, and transmission gates MN55, MN56, MN57 and MN58 to select $V_{g2,p}$ and $V_{g2,n}$ for each row. The circuit block 500 is provided for each row and configures the circuit block 401 along with a row decoder 501.

A select signal $V_{sel0}$#i that is an output from the row decoder 501 based on the address value ADD is a signal swinging between the potential $V_{DD}$ and the potential $V_{SS}$. In order to realize the high threshold operation, the signal is level shifted to a signal $V_{sel1,p}$ having an amplitude larger than that of $V_{g2,p,HiVt}$ applied to the second gate, and its inverse logic signal $V_{sel1,p}$~, and at the same time to a signal $V_{sel1,n}$ swinging between $V_{g2,n,HiVt}$ and $V_{DD}$, and its inverse logic signal $V_{sel1,n}$~. The level shifted signals drive the nMOS transmission gates MN55 to MN58, and a switching between $V_{g2,p,LoVt}$ and $V_{g2,p,HiVt}$, and a switching between $V_{g2,n,LoVt}$ and $V_{g2,n,HiVt}$ are performed. Thus, the bias voltage applied to the second gate can be switched.

In addition, in order to reduce the number of supply voltages, $V_{DD,Vtsel}$ shown in FIG. 5 which determines an amplitude of $V_{sel1,p}$ can be replaced by $V_{g2,p,HiVt}$. But in this case, voltage has to be determined in advance by considering that only voltage amplitude up to $V_{g2,p,HiVt} - V_{t,n}$ is obtainable by the output of the transmission gate MN55.

First Modification of the First Embodiment

Figure 7:
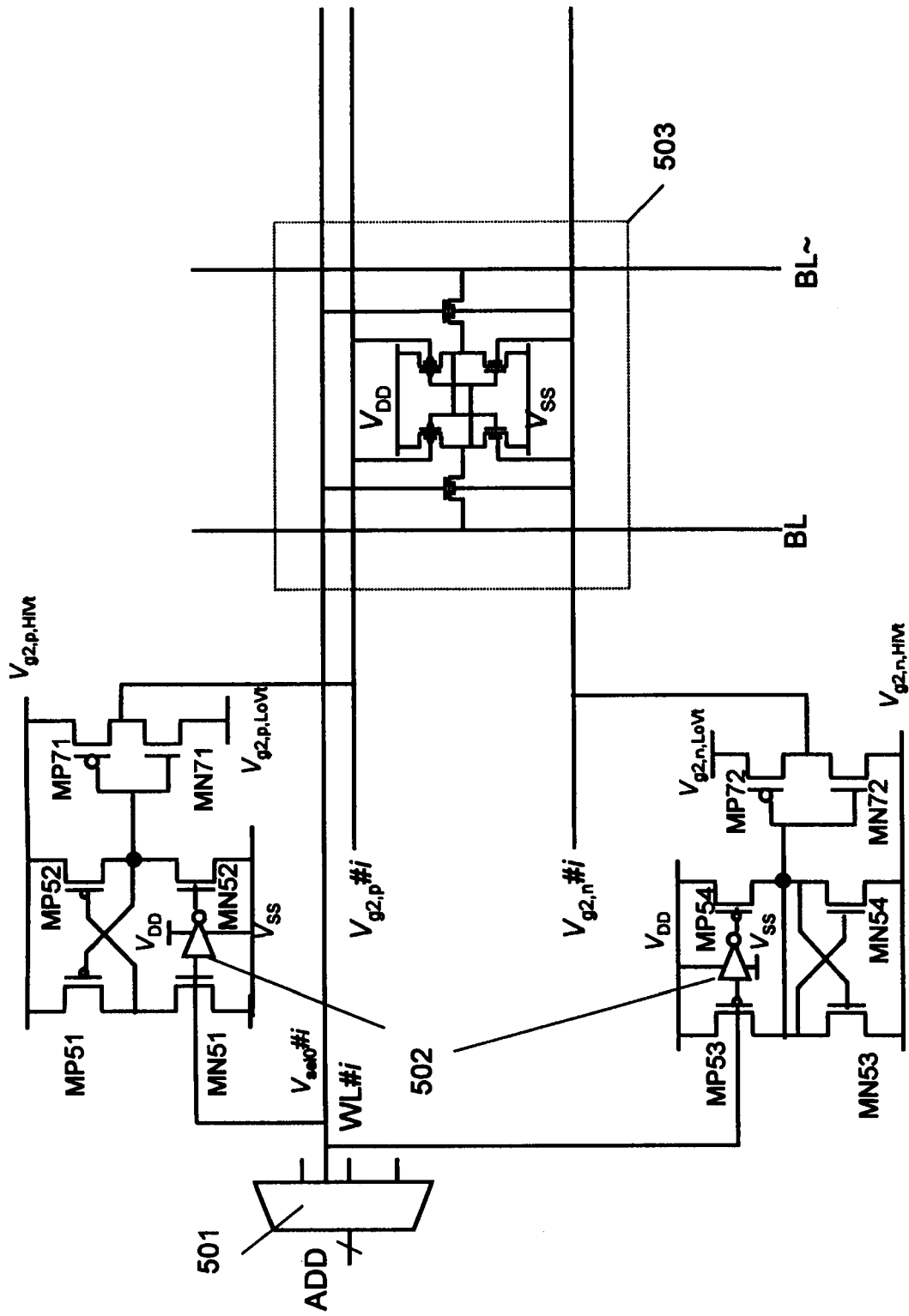
FIG. 7 is a circuit diagram showing another internal configuration of the circuit block 401 different from that shown in FIG. 5 in accordance with the first modification of the first embodiment.

When $V_{sel,p}$ is replaced by $V_{g2,p,HiVt}$ in order to reduce the number of supply voltages as descried in the first embodiment, reduction in the output voltage of the transmission gate becomes a problem. This reduction in the output voltage depends on threshold voltage variations. An alternative way to overcome this problem is to use pMOS transistors as the transmission gates MN55, MN56 or to use two inverters in place of the transmission gates as shown in FIG. 7. An inverter consisting of MP71 and MN71 uses $V_{g2,p,HiVt}$ and $V_{g2,p,LoVt}$, and the other inverter consisting of MP72 and MN72 uses $V_{g2,n,LoVt}$ and $V_{g2,n,HiVt}$ as high and low voltage sources.

Second Modification of the First Embodiment

Figure 8:
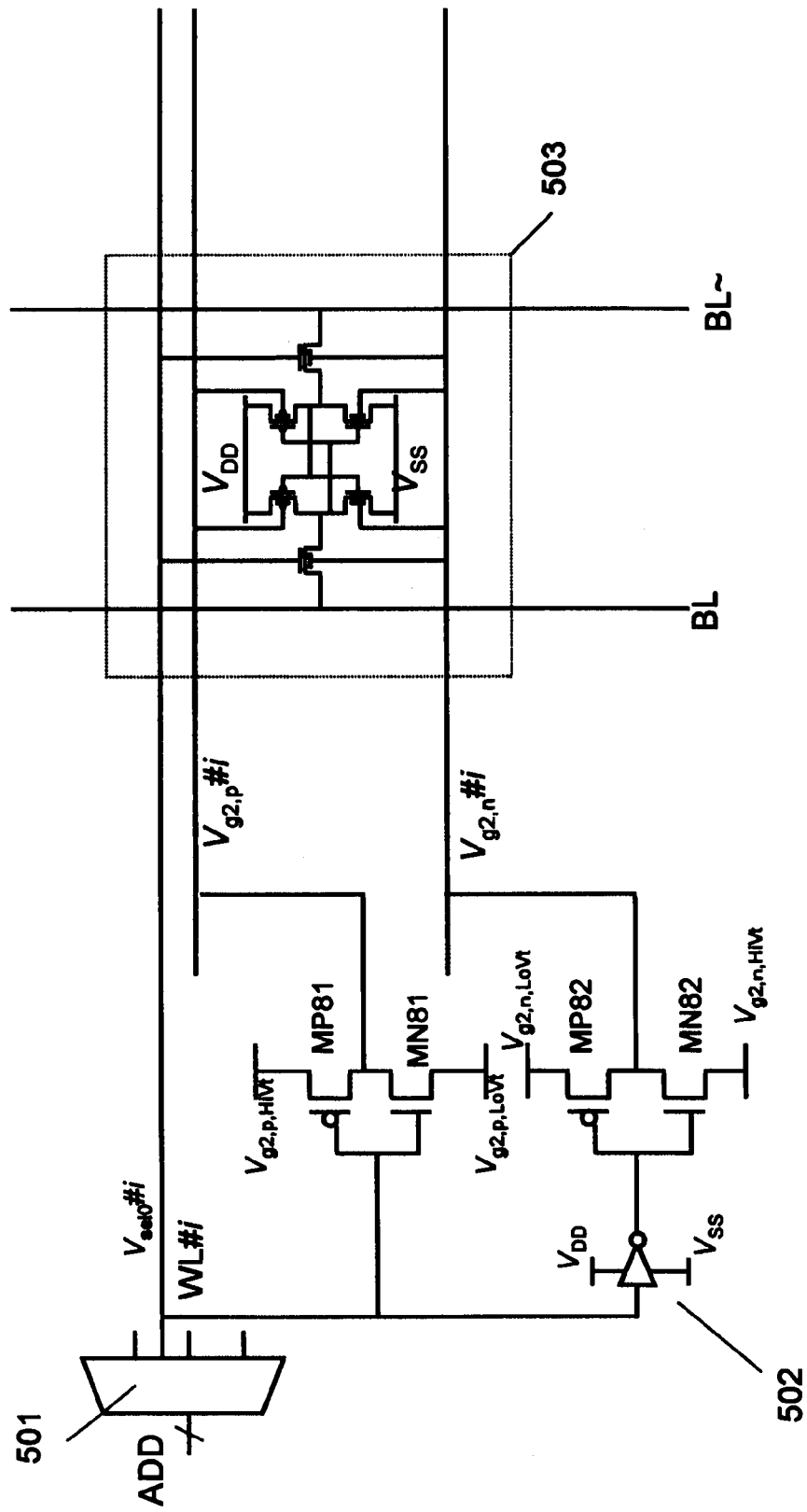
FIG. 8 is a circuit diagram showing the other internal configuration of the circuit block 401 different from those shown in FIG. 5 and FIG. 7 in accordance with the second modification of the first embodiment.

Under some design conditions of the four-terminal double-gate field effect transistor, a magnitude relation of the voltages is $V_{SS} \leq V_{g2,n,HiVt} < V_{g2,n,LoVt} < V_{DD}$ and $V_{SS} \leq V_{g2,p,LoVt} < V_{g2,p,HiVt} < V_{DD}$. In this case, control of $V_{g2}$ in the first embodiment can be easily realized by a circuit comprising a CMOS inverter consisting of MP81 and MN81, and a CMOS inverter consisting of MP82 and MN82 as shown in FIG. 8, instead of the circuits shown in FIG. 5 and FIG. 7. The inverter consisting of MP81 and MN81 is driven by $V_{g2,p,HiVt}$ and $V_{g2,p,LoVt}$, and the inverter consisting of MP82 and MN82 is driven by $V_{g2,n,LoVt}$ and $V_{g2,n,HiVt}$.

Second Embodiment

Under some operating conditions, rise of the row select signal occurs prior to the change in $V_{g2}$, the memory cell under the high threshold operation is coupled to the bit line, and therefore the operation becomes unstable. In order to avoid this situation from happening, a mechanism for generating the row select signal according to the state of $V_{g2}$ of a row may be provided, instead of using the decoded signal directly as the row select signal. This is achieved by adding a circuit block 900 shown in FIG. 9 to the circuit shown in FIG. 5 or FIG. 7. The circuit block 900 comprises MP91, MN91, MP92, MN92, an inverter 901, an inverter consisting of MP93 and MN93. The row select signal shifted into $V_{g2,p,LoVt} \leq V_{g2,p} \leq V_{g2,p,HiVt}$ by the circuit shown in FIG. 5 or FIG. 7 is reshifted into the original voltage amplitude $V_{SS} \leq V_{sel2} \leq V_{DD}$ by the circuit shown in FIG. 9. By this configuration, the row select signal changes after $V_{g2}$ is varied in each row.

Figure 10:
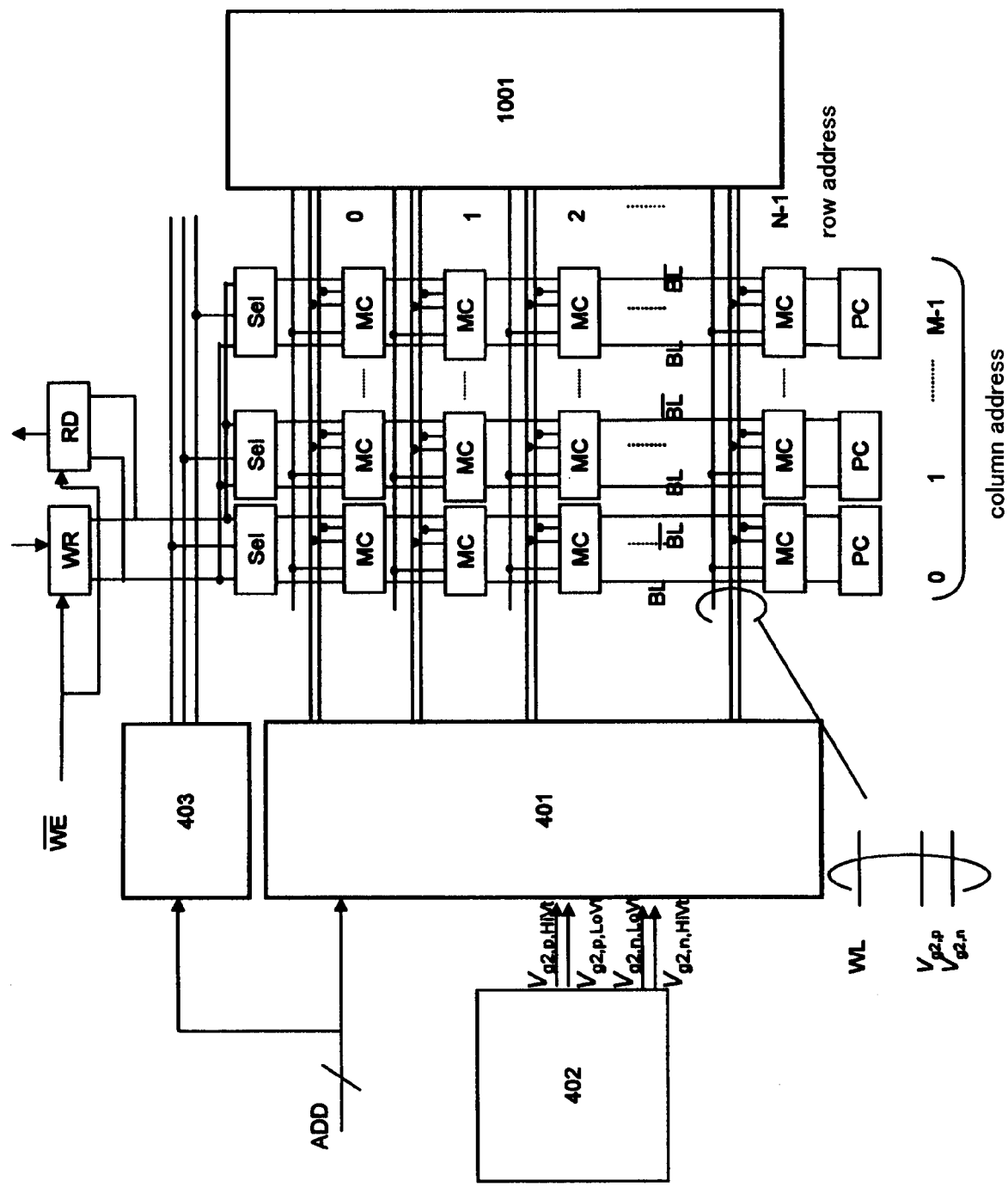
FIG. 10 is a block diagram of an SRAM device comprising a circuit block 1001 consisting of the circuit blocks 900 in accordance with the second embodiment of the present invention.

FIG. 10 shows a circuit configuration of an SRAM cell array. In FIG. 10, WLs driven by the circuit block 401 in FIG. 5 and FIG. 7 are separated from the circuit block 401, and are driven by a circuit block 1001 consisting of the same number of the circuit blocks 900 as rows.

Figure 11:
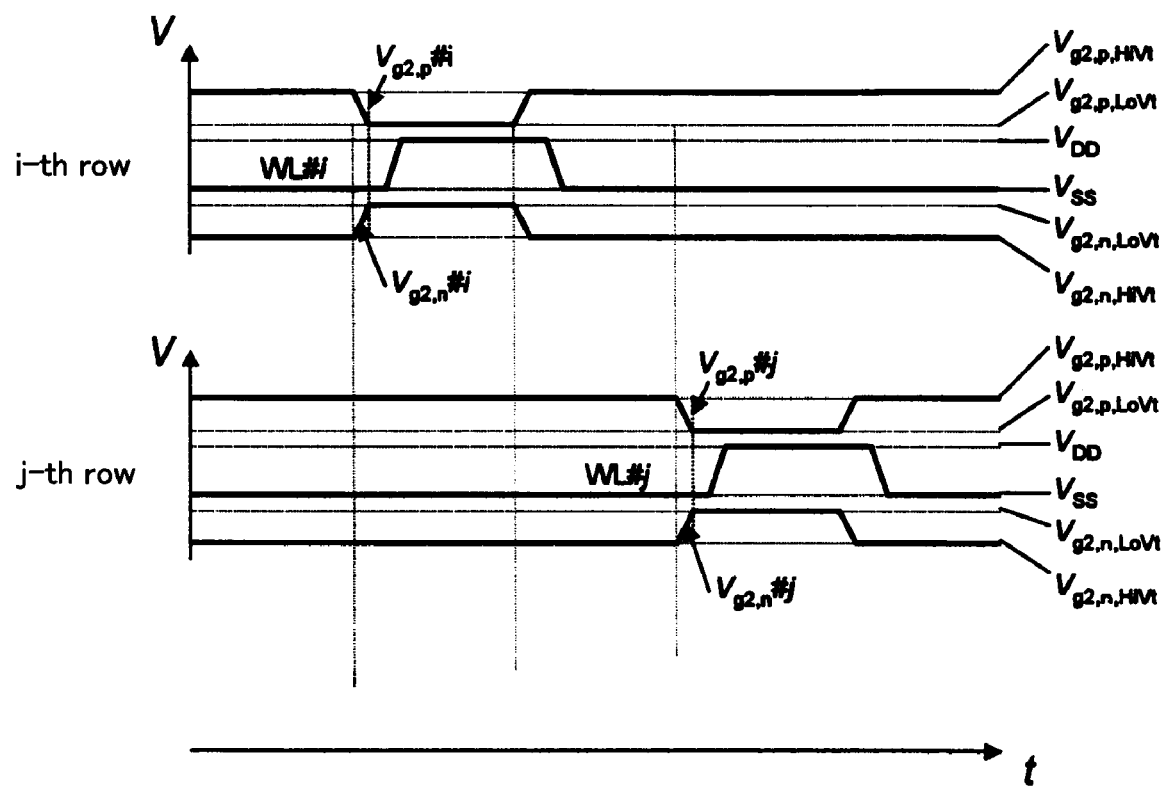
FIG. 11 is a schematic view showing variation in bias voltages applied to an SRAM cell with respect time (t) in accordance with the second embodiment of the present invention.

By this configuration, voltage is varied as shown in FIG. 11. The WL rises shortly after $V_{g2}$ rises. This order is maintained even if conditions varies among selected rows.

The circuit operates in the same way by using a change in $V_{g2,n}$ in place of $V_{g2,p}$ if it is modified appropriately.

Third Embodiment

Figure 12:
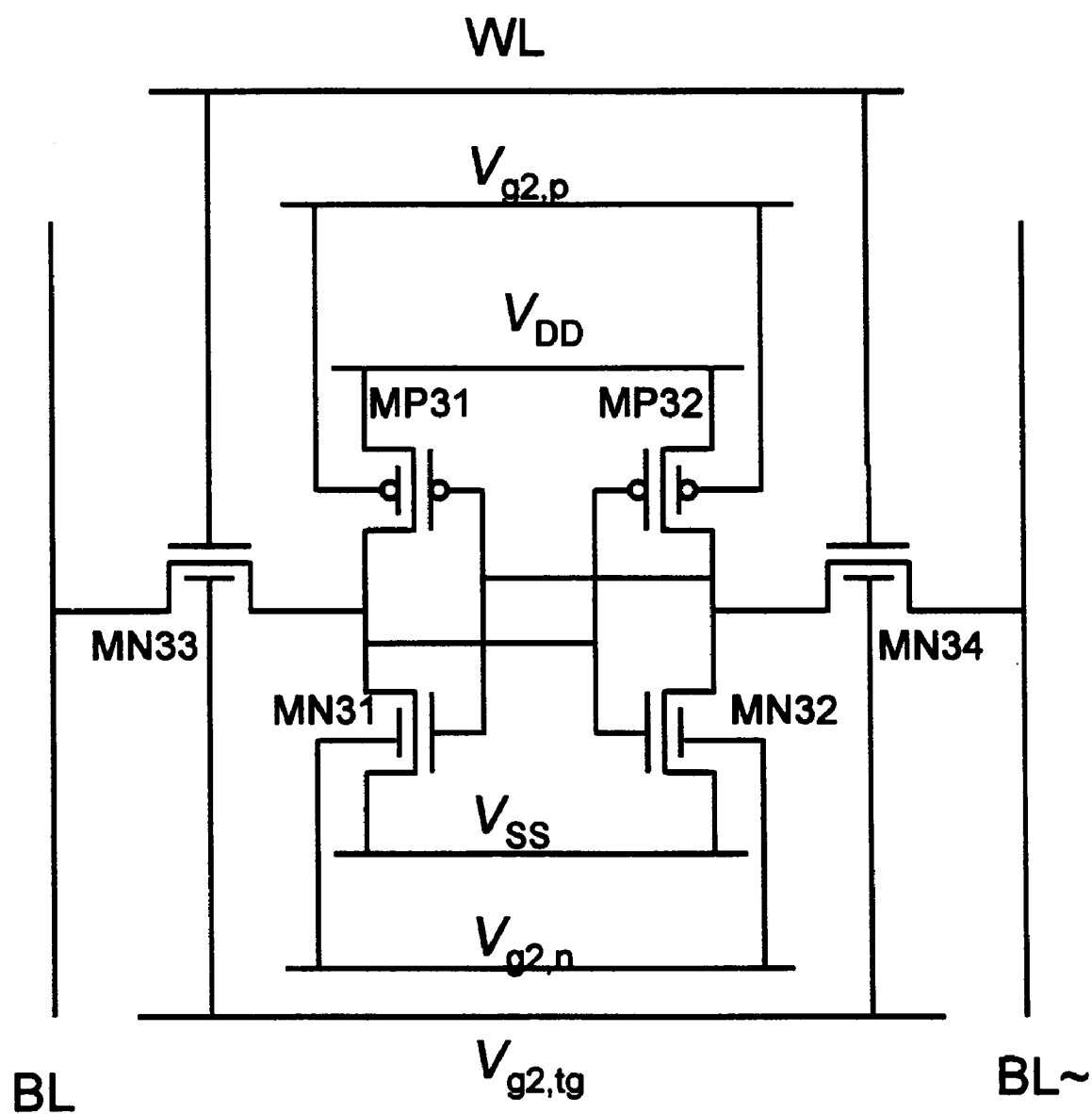
FIG. 12 is a circuit diagram showing a configuration of an SRAM cell using four-terminal double-gate field effect transistors in accordance with the third embodiment of the present invention.

In the first embodiment, the n-channel four-terminal double-gate field effect transistors as the access transistors and the flip-flop circuit are supplied with the same voltages $V_{g2}$. In this configuration, current in the access transistors increases when the memory cell is accessed, which may cause operational instabilities in some designs. Therefore, in this embodiment, the second gates of the access transistors are separated from the $V_{g2}$ lines for the flip-flop circuit, and a $V_{g2,tg}$ line that connects all access transistors in the same row is added as shown in FIG. 12.

$V_{g2,tg}$ applied to the $V_{g2,tg}$ line is a constant value that keeps a high threshold voltage within the voltage range to ensure the necessary operation speed in the array. Therefore, the operational stability is improved. Thanks to the constant value, no additional peripheral circuit is required.

Figure 9:
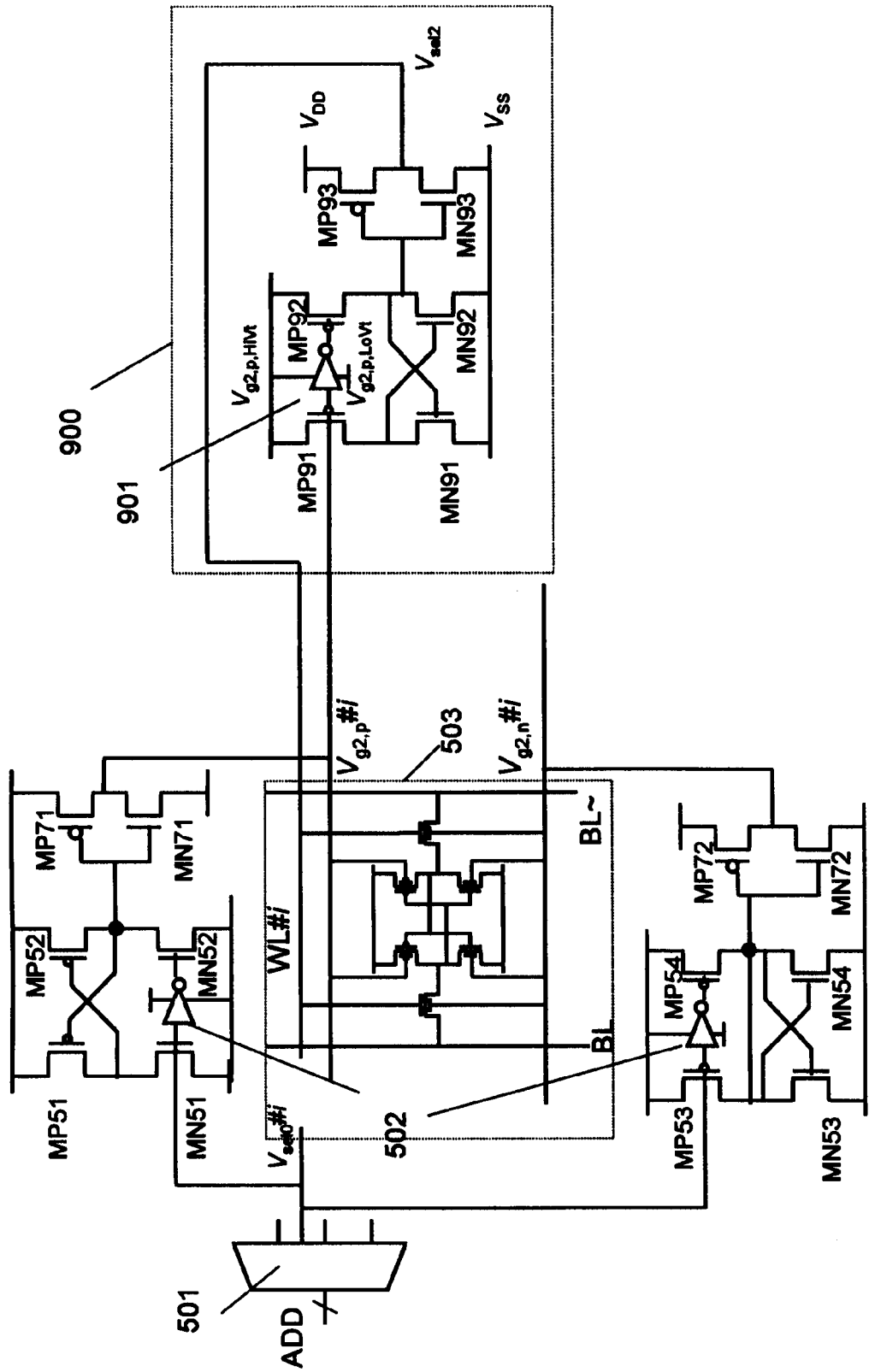
FIG. 9 is a circuit diagram showing an internal configuration of a circuit block 900 in accordance with the second embodiment of the present invention.
Figure 13:
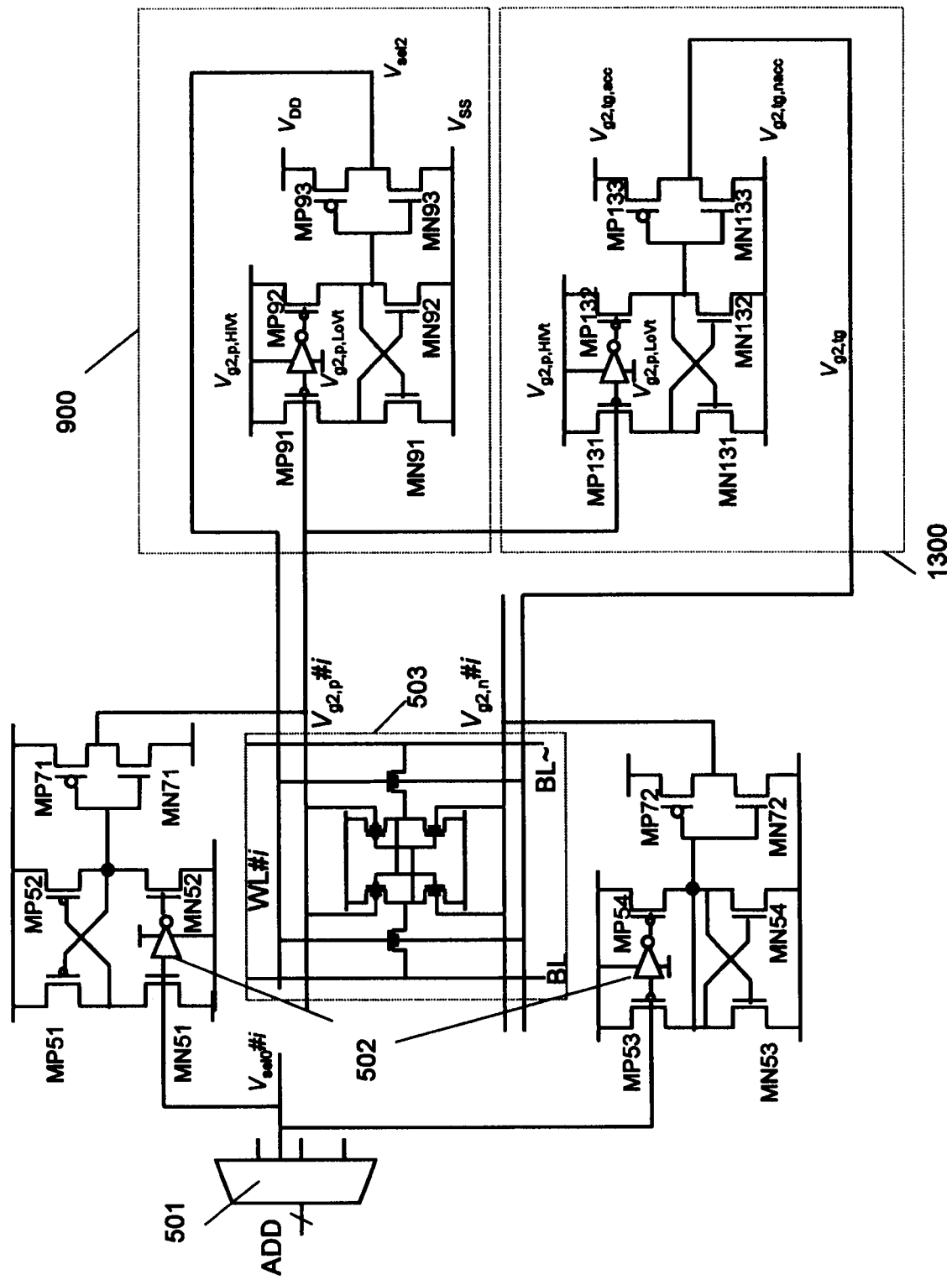
FIG. 13 is a circuit diagram showing an internal configuration of a circuit block 1300 to drive a SRAM cell shown in FIG. 12 in accordance with the third embodiment of the present invention.
Figure 14:
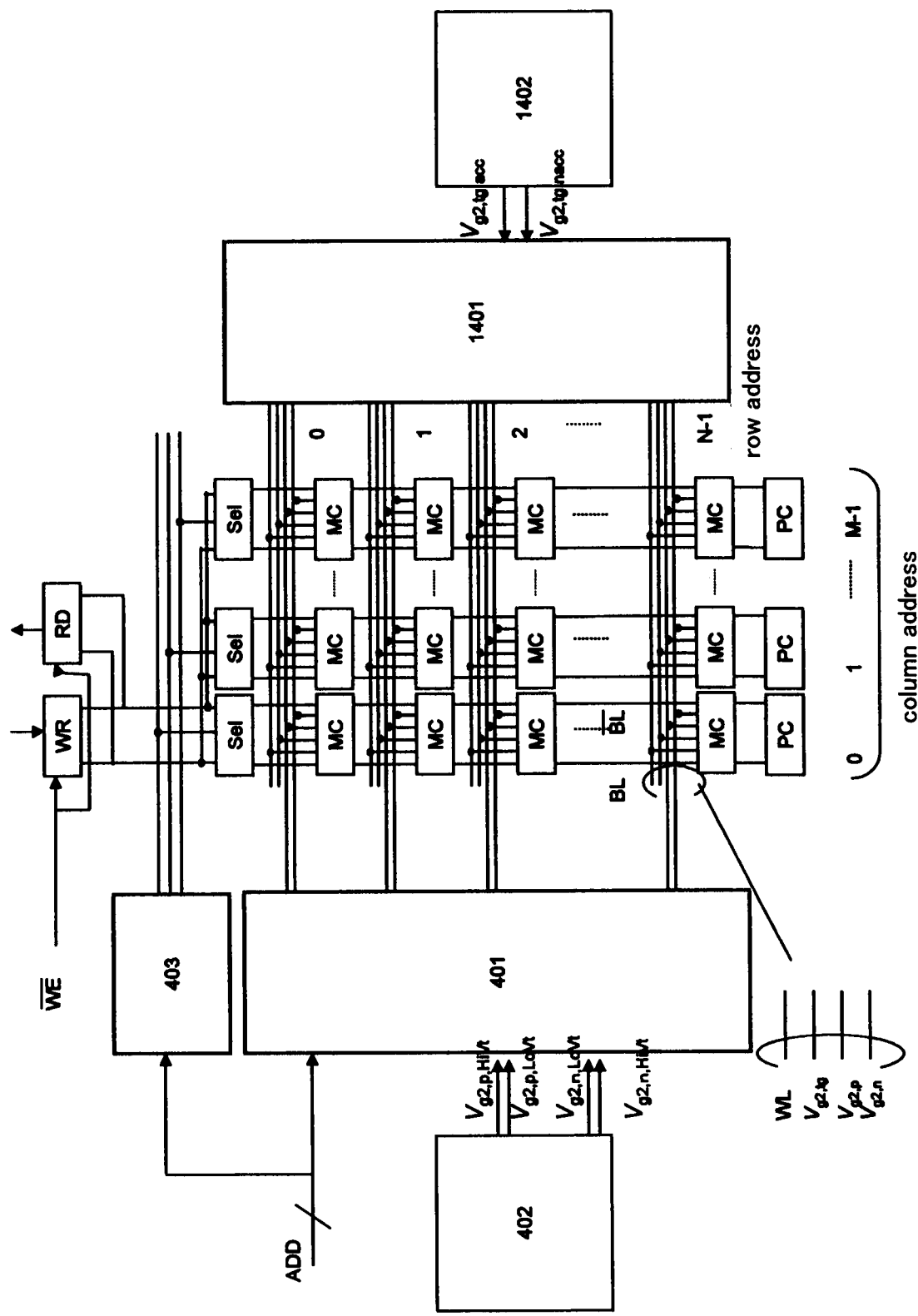
FIG. 14 is a block diagram of an SRAM device comprising the circuit block 900 and the circuit block 1300 in accordance with the third embodiment of the present invention.

FIG. 13 shows a circuit configuration in which a circuit block 1300 having a similar configuration to the circuit block 900 is added to that shown in FIG. 9. By using this configuration, the SRAM cell device can be operated at the optimum point of the operational stability and operation speed. In other words, as shown in FIG. 13, if the row is accessed, then a voltage $V_{g2,tg,acc}$ is applied to $V_{g2,tg}$. Else, a voltage $V_{g2,tg,nacc}$ that is different from $V_{g2,tg,acc}$ is applied to $V_{g2,tg}$. Here, the access to that raw is detected from either of $V_{g2,p}$ or $V_{g2,n}$. By this operation, each voltage can be output in accordance with a timing chart shown in FIG. 15. The circuit block 1300 is required to employ $V_{g2,tg,acc}$ and $V_{g2,tg,nacc}$ instead of $V_{DD}$ and $V_{SS}$ as compared with the circuit block 900. FIG. 14 is a block diagram showing the SRAM device of the third embodiment. As compared with FIG. 10, a bias voltage generation circuit 1402 to generate supply voltages $V_{g2,tg,acc}$ and $V_{g2,tg,nacc}$ is newly added, and a circuit block 1401 is also implemented in place of the circuit block 1001. The circuit block 1401 consists of the same number of the circuit blocks 900 and circuit blocks 1300 as rows, receives the generated voltages by the circuit blocks 1300 so as to output voltages, and at the same time drives the WLs.

Figure 15:
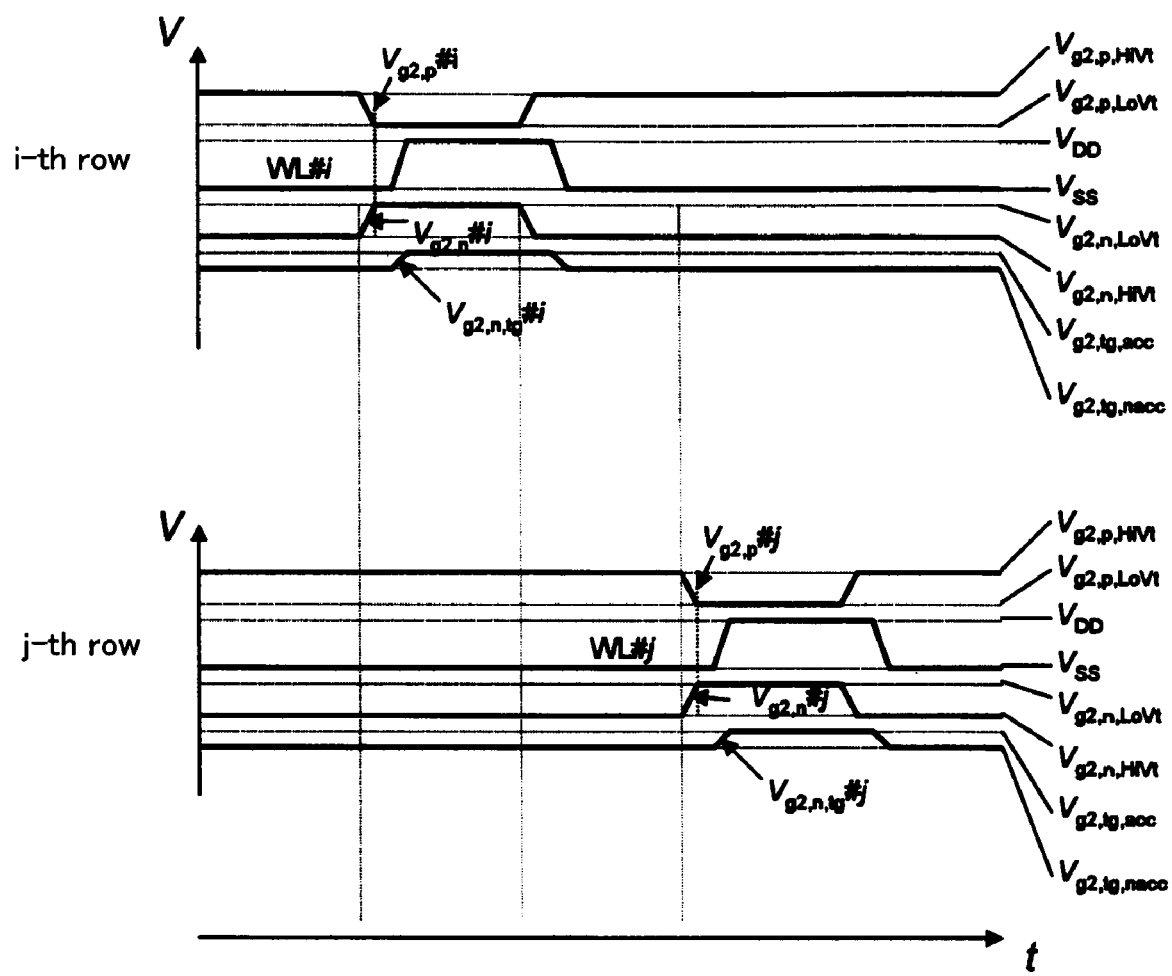
FIG. 15 is a schematic view showing variation in bias voltages applied to an SRAM cell with respect time (t) in accordance with the third embodiment of the present invention.

A similar circuit can be realized by using $V_{g2,n}$ instead of $V_{g2,p}$ as an input to the circuit block 1300 and by using $V_{g2,n,LoVt}$ instead of $V_{g2,p,HiVt}$ as a supply voltage of the circuit 1300. Also, levels of $V_{g2,tg,acc}$ and $V_{g2,tg,nacc}$ shown in FIG. 15 are just examples, and in practice these levels are optimized by considering the operation stability.

Fourth Embodiment

Figure 16:
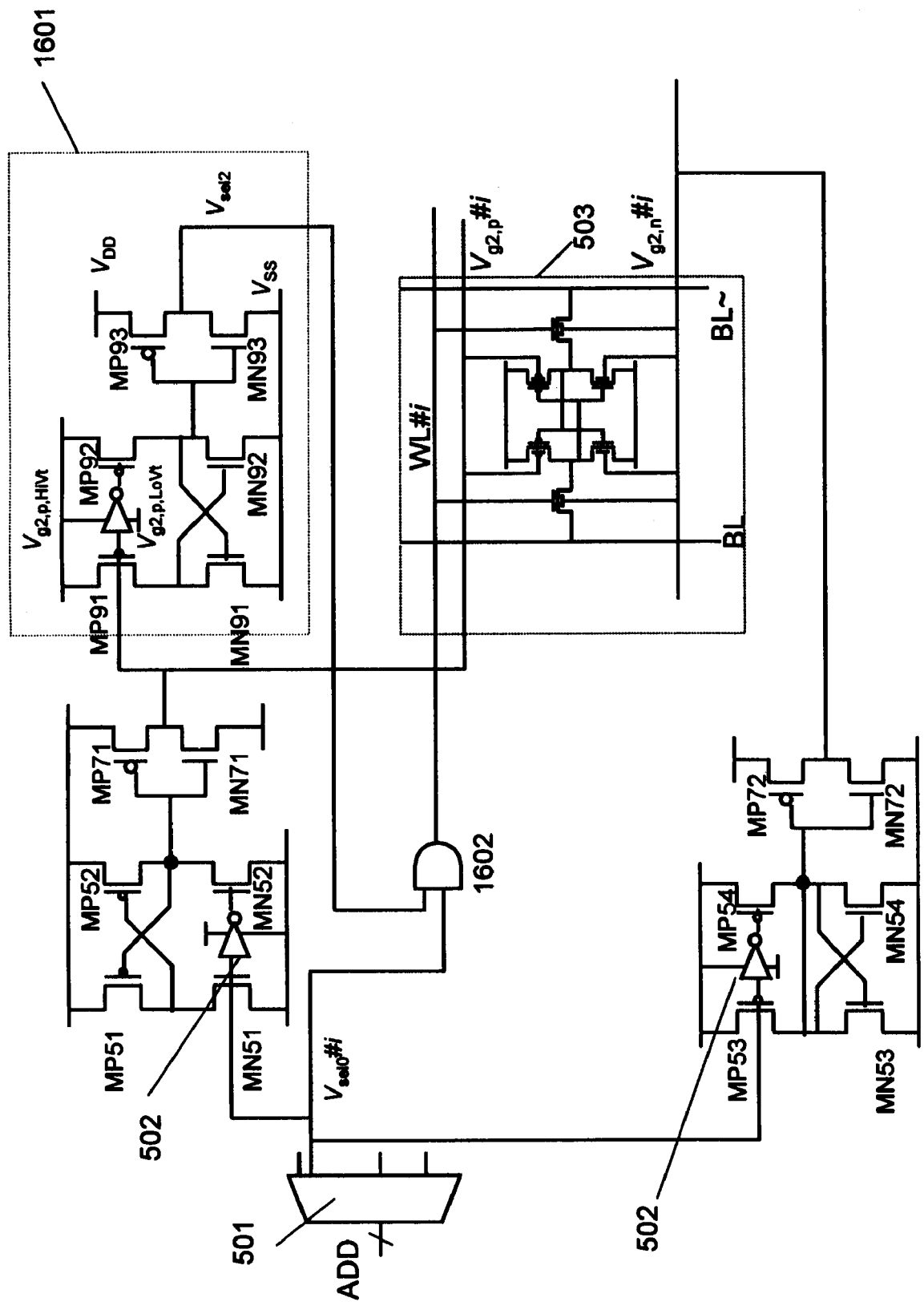
FIG. 16 is circuit diagram showing a circuit comprising a circuit block 1601 and a logic gate 1602 in accordance with the fourth embodiment of the present invention.
Figure 17:
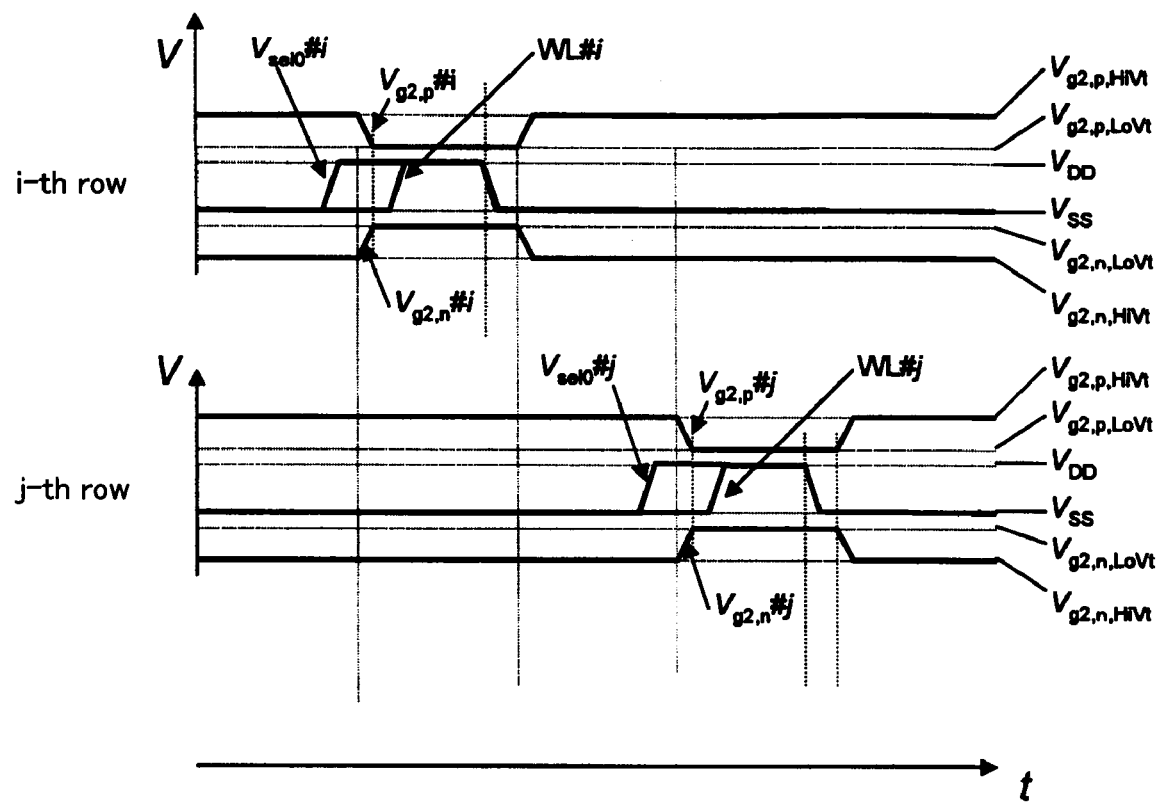
FIG. 17 is a schematic view showing a timing realized by a circuit in accordance with the fourth embodiment of the present invention.

In the second embodiment, stability is ensured only during the rising time of the signal of the WL. However, similar stability problem might happen with respect to the falling order of the WL and $V_{g2}$'s during the falling time of WL. In order to prevent this problem, it is effective to adopt a circuit such as shown in FIG. 16 which realizes the falling down of the WL prior to the change in $V_{g2}$'s. In other words, a circuit block 1601 equivalent to the circuit block 900 is implemented into the circuit block 401 without using the circuit block 900 and the circuit block 1001, and an AND logic gate 1602 that calculates an logical AND of the output signal $V_{sel0}$ from the row decoder 501 and an output signal $V_{sel2}$ from the circuit block 1601 is implemented into the circuit block 401, thereby generating a timing such as shown in FIG. 17. By using this circuit, all stability problems can be solved. An entire configuration of the array is similar to that shown in FIG. 4.

The circuit operates in the same way by using changes in $V_{g2,n}$ in place of that in $V_{g2,p}$ if it is appropriately modified.

The configuration disclosed in this embodiment can be used in combination with the third embodiment. In this case, the circuit block 900 and the circuit block 1300 are implemented into the circuit block 401, and furthermore the logic gate 1602 is implemented into the circuit block 401.

First Modification of the Fourth Embodiment

Figure 18:
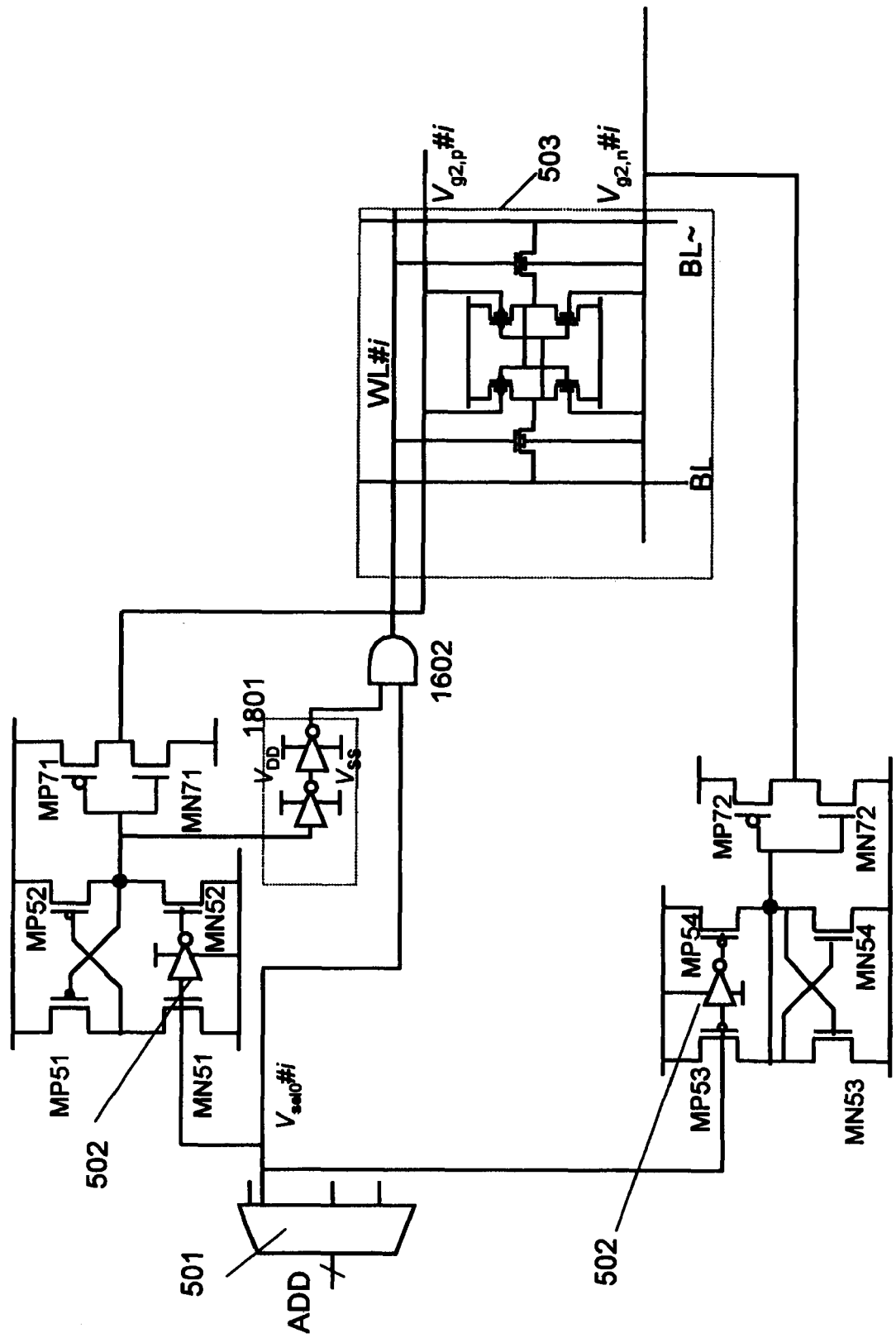
FIG. 18 is a circuit diagram showing a circuit comprising a timing adjustment buffer 1801 in accordance with the first modification of the fourth embodiment.

The fourth embodiment can be simplified when delays in the WL, the $V_{g2,p}$ line and $V_{g2,n}$ line parallel to the WL can be estimated precisely to some extent. In other words, a time adjustment buffer 1801 to generate a time delay equivalent to the summed values of delays in MP71, MN71, and the circuit block 1601 is provided as shown in FIG. 18 instead of generating a signal of the WL from the signal of $V_{g2,p}$ by using MP71, MN71, and the circuit block 1601 shown in FIG. 16, thereby enabling to generate a timing similar to that shown in FIG. 17. This buffer 1801 is implemented into the circuit block 401.

This configuration can be also used in combination with the third embodiment.

Fifth Embodiment

Figure 19:
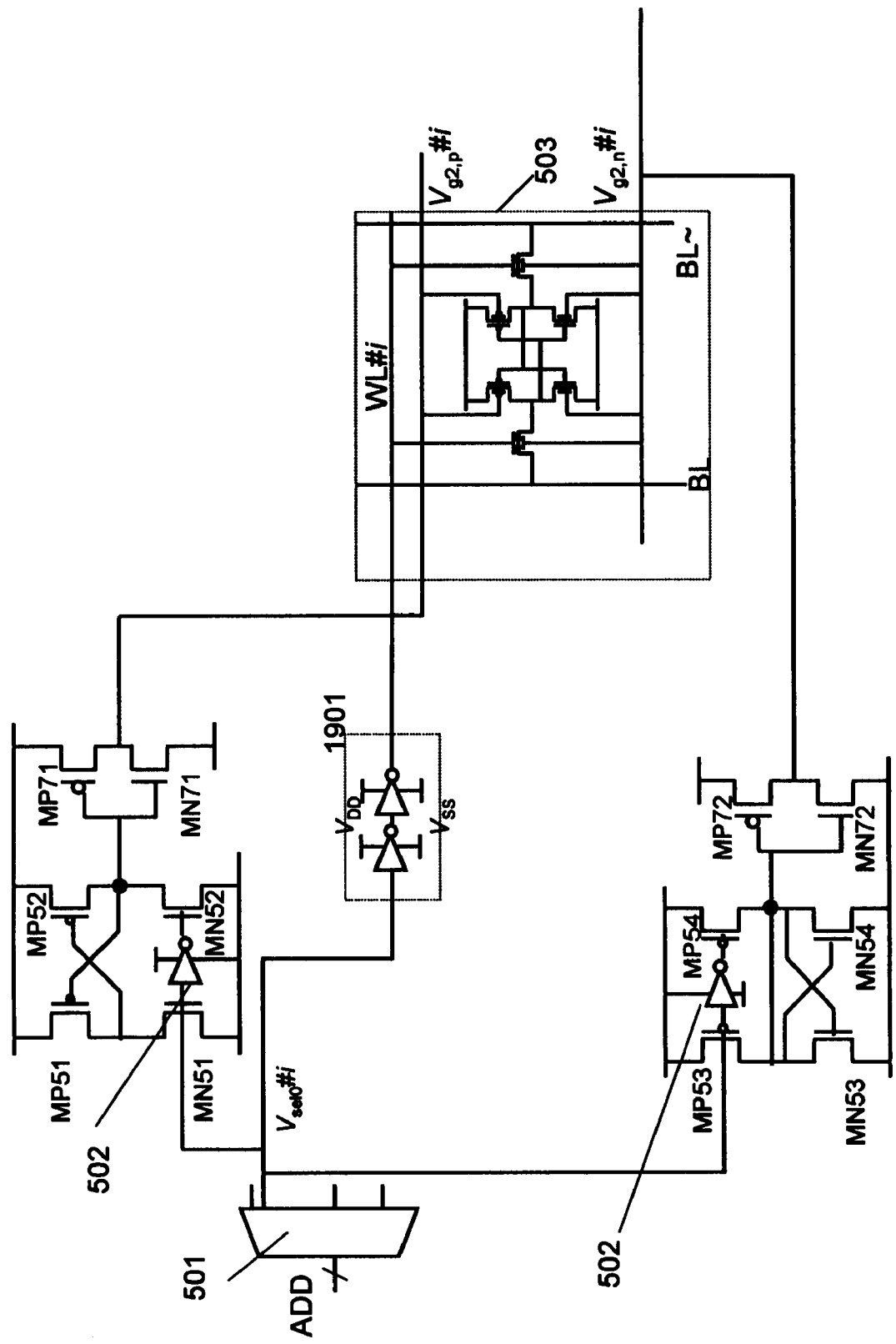
FIG. 19 is a circuit diagram showing a circuit comprising a timing adjustment buffer 1901 in accordance with the fifth embodiment of the present invention.

The configurations can be more simplified when the delays in WL, $V_{g2,p}$ and $V_{g2,n}$ can be exactly known in the second embodiment and its modification, and the fourth embodiment and its modification. More particularly, the timing such as shown in FIG. 6 can be generated easily by implementing a time adjustment buffer 1901 into the circuit block 401 as shown in FIG. 19. The time adjustment buffer 1901 generates a time delay equivalent to the delays in a level shifters for generating $V_{g2,p}$ and $V_{g2,n}$/and the interconnection lines.

This configuration can also be used in combination with the third embodiment.

WL and $V_{g2}$ are connected directly to the decoder 501 and the level shifters, however, in some cases, it may effective for the performance improvement in view of delay to provide a buffer for driving the interconnection lines.

The invention claimed is:

1. An SRAM device comprising a memory cell, the memory cell comprising two access transistors connected to a word line, and a flip-flop circuit having complementary transistors, the transistor being a field effect transistor having a standing semiconductor thin plate, a logic signal input gate and a bias voltage input gate, the gates sandwiching the semiconductor thin plate and being electrically separated from each other, wherein a first bias voltage is applied to bias voltage input gates of the transistors of the memory cells in a row including a memory cell being accessed for reading or writing such that the threshold voltage on the logic signal input gates of the transistors is set low, a second bias voltage is applied to the bias voltage input gates of the transistors of the memory cells in a row including a memory cell under memory holding operation such that the threshold voltage on the logic signal input gates of the transistors is set high, the SRAM device further comprising a row-decoder to output a signal, the first bias voltage and the second bias voltage are switched by a signal generated by shifting the level of the row-decoder output signal, the word line is selected after an address a signal arrives at the row decoder and a switching operation of the bias voltage in each row is completed, and the word line is driven by a signal which is generated from a signal on an interconnection line of the bias voltage input gates by shifting the signal swing from that between the first bias voltage and the second bias voltage to that between a low voltage source $V_{ss}$ and a high voltage source $V_{DD}$, according to whether the bias voltage of the bias voltage input gate is set to the first bias voltage or the second bias voltage.

2. The SRAM device according to claim 1, wherein a bias voltage of the access transistors is set to a voltage different from a bias voltage of the complementary transistors in the flip-flop circuit.

3. The SRAM device according to claim 2, wherein a bias voltage of the access transistors in an accessed row is set to a value different from a bias voltage of the access transistors in an unaccessed row.

4. The SRAM device according to claim 1, wherein the interconnection line connecting the bias voltage input gates of the transistors in the memory cell and the interconnection line connecting the bias voltage input gates of the access transistors are arranged in parallel with the word line.

* * * * *